(12) United States Patent
Butler et al.

(10) Patent No.: US 12,743,035 B2
(45) Date of Patent: Sep. 22, 2026

(54) METHOD OF SPATIALLY ALIGNING A PATTERNING DEVICE AND A SUBSTRATE

(71) Applicant: ASML Netherlands B.V., Veldhoven (NL)

(72) Inventors: Hans Butler, Best (NL); Marinus Petrus Reijnders, Eindhoven (NL); Patricius Aloysius Jacobus Tinnemans, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 151 days.

(21) Appl. No.: 18/854,742

(22) PCT Filed: Mar. 14, 2023

(86) PCT No.: PCT/EP2023/056420
§ 371 (c)(1),
(2) Date: Oct. 7, 2024

(87) PCT Pub. No.: WO2023/198382
PCT Pub. Date: Oct. 19, 2023

(65) Prior Publication Data

US 2025/0251671 A1 Aug. 7, 2025

(30) Foreign Application Priority Data

Apr. 15, 2022 (EP) .................................... 22168671

(51) Int. Cl.
*G03F 9/00* (2006.01)
*G01B 9/02056* (2022.01)
*G03F 7/00* (2006.01)

(52) U.S. Cl.
CPC ....... *G03F 9/7046* (2013.01); *G01B 9/02059* (2013.01); *G03F 7/70258* (2013.01); *G03F 9/7019* (2013.01)

(58) Field of Classification Search
CPC ............. G03F 7/70775; G03F 7/70258; G03F 9/7019; G03F 7/7085; G03F 9/7046; G01B 9/02059; G01B 9/02072
(Continued)

(56) References Cited

U.S. PATENT DOCUMENTS 5,166,754 A * 11/1992 Suzuki .................. G03F 9/7023 356/400
2002/0048026 A1* 4/2002 Isshiki ................ H01J 37/3045 356/498
(Continued)

FOREIGN PATENT DOCUMENTS

EP 1 107 068 B1 7/2007
EP 1 469 348 B1 1/2012
(Continued)

OTHER PUBLICATIONS

International Search Report and Written Opinion of the International Searching Authority directed to International Patent Application No. PCT/EP2023/056420, mailed May 15, 2023; 10 pages.

*Primary Examiner* — Steven H Whitesell
(74) *Attorney, Agent, or Firm* — Finnegan, Henderson, Farabow, Garrett & Dunner LLP

(57) ABSTRACT

A method of spatially aligning a patterning device and a substrate, wherein the patterning device and the substrate are separated by an optical path comprising one or more moveable optical components is described, the method comprising: —performing a plurality of alignment measurements, wherein for each alignment measurement the moveable optical components are arranged in respective predetermined positions, —combining the alignment measurements, and —spatially aligning the patterning device and the substrate based on the combination of the alignment measurements.

12 Claims, 4 Drawing Sheets

(58) Field of Classification Search
USPC .................................................. 356/399–401
See application file for complete search history.

(56) References Cited

U.S. PATENT DOCUMENTS

| | | | | |
|---|---|---|---|---|
| 2002/0171844 | A1* | 11/2002 | Hill .................... | G01B 9/02059 356/500 |
| 2004/0257549 | A1* | 12/2004 | Leenders ............. | G03F 9/7019 355/53 |
| 2011/0205513 | A1 | 8/2011 | Padiy et al. | |
| 2015/0062596 | A1* | 3/2015 | Kwan ..................... | G03F 7/709 356/614 |
| 2016/0054117 | A1 | 2/2016 | Yamamoto | |
| 2019/0265019 | A1 | 8/2019 | Jansen et al. | |
| 2022/0260359 | A1* | 8/2022 | Zschaeck ........... | G01B 9/02072 |
| 2022/0269186 | A1* | 8/2022 | Hattori .................. | G03F 7/0002 |

FOREIGN PATENT DOCUMENTS

| | | | | | |
|---|---|---|---|---|---|
| JP | 4469609 | B2 | | 5/2010 | |
| WO | WO-2017186447 | A1 | * | 11/2017 | ........... G03F 9/7003 |
| WO | WO 2021/094340 | A1 | | 5/2021 | |

* cited by examiner

METHOD OF SPATIALLY ALIGNING A PATTERNING DEVICE AND A SUBSTRATE

CROSS-REFERENCE TO RELATED APPLICATIONS

This application claims priority of EP Application Serial No. 22168671.0 which was filed on Apr. 15, 2022 and which is incorporated herein in its entirety by reference.

FIELD

The present invention relates to a method of spatially aligning a patterning device and a substrate in a lithographic apparatus, wherein the patterning device and the substrate are separated by an optical path comprising one or more moveable optical components.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In order to accurately pattern the substrate with the pattern of the patterning device, an accurate alignment of the substrate and the patterning device are required. In order to do so, it is known to determine an aligned position between the patterning device and a substrate, or substrate table holding the substrate, by projecting a pattern or image of one or more markers that are present on the patterning device onto a sensor arranged on the substrate table holding the substrate. Typically, such an alignment process involves projecting the pattern along an optical path which comprises one or more optical components such as mirrors or lenses. During such alignment process, the optical components are typically held in a fixed position. In case these components are or need to be displaced during a subsequent patterning or exposure process, it has been found that the determined aligned position may be flawed or inaccurate, potentially causing an overlay error during the patterning process.

SUMMARY

It is an object of the present invention to provide an improved alignment between a patterning device and a substrate, in particular in case moveable optical components are used during a pattering process in a lithographic apparatus.

According to a first aspect of the present invention, there is provided a method of spatially aligning a patterning device and a substrate, wherein the patterning device and the substrate are separated by an optical path comprising one or more moveable optical components, the method comprising:

performing a plurality of alignment measurements, wherein for each alignment measurement the moveable optical components are arranged in respective predetermined positions, combining the alignment measurements, and spatially aligning the patterning device and the substrate based on the combination of the alignment measurements.

According to a second aspect of the invention, there is provided an apparatus comprising:

a support structure configured to support a patterning device;

a substrate table configured to support a substrate;

a projection system comprising a plurality op moveable optical components, the moveable optical components providing an optical path between the patterning device and the substrate;

a positioning system configured to position the patterning device, the substrate and the moveable optical components of the projection system;

a position measurement system configured to measure a position of the support structure, the substrate table and the moveable optical components of the projection system;

a control unit, the control unit being configured to control the positioning system;

wherein the apparatus is configured to receive a radiation beam to irradiate the patterning device and wherein the control unit is configured to control the apparatus to perform the method of spatially aligning the patterning device and the substrate according to the first aspect of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
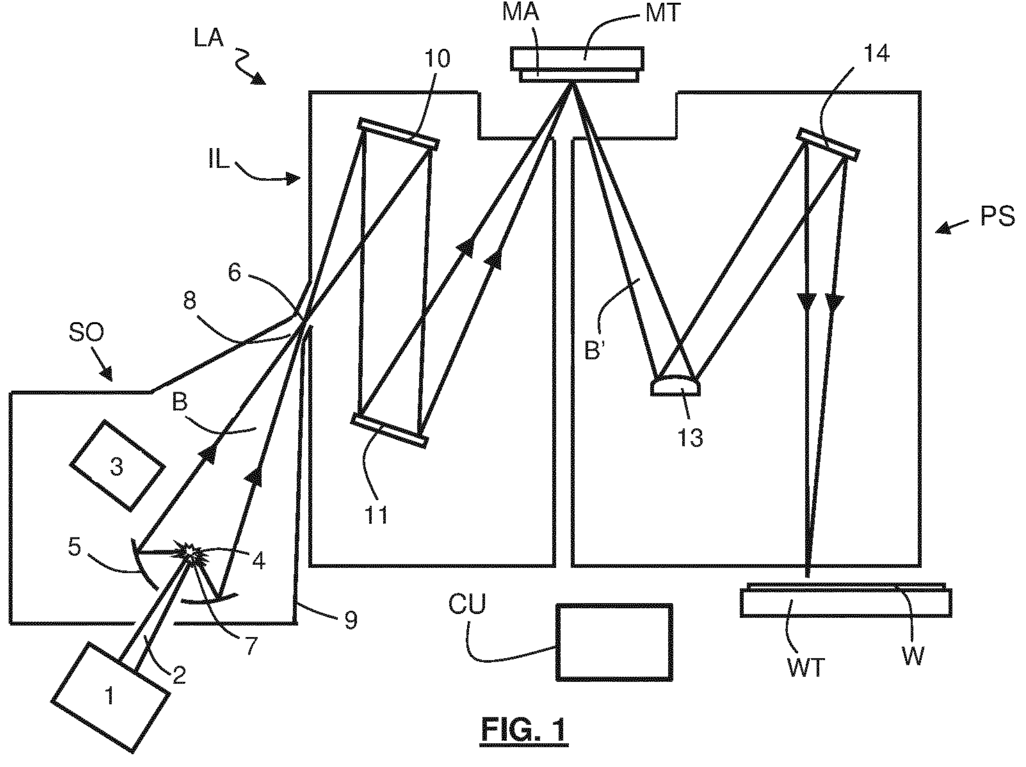
FIG. 1 depicts a lithographic system according to the invention comprising a lithographic apparatus and a radiation source.

FIG. 1 shows a lithographic system comprising a radiation source SO and a lithographic apparatus LA according to the invention. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. In accordance with the present invention, the mirrors 13, 14 may also be referred to as moveable optical components which can be displaced or moved, e.g. during a patterning or exposure process and during an alignment process. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

The lithographic apparatus LA as shown further comprises a control unit CU. In general, the control unit CU can be configured to control an operation of the lithographic apparatus. In particular, the control unit CU can e.g. be configured to control a positioning of the support structure MT and/or a positioning of the substrate table WT. In accordance with the present invention, the control unit CU can be configured to control the lithographic apparatus to perform a method of spatially aligning the patterning device MA and the substrate W, in accordance with the present invention. In order to do so, the control unit CU can e.g. be configured to also control a position of the mirrors 13,14 of the projection system PS. Further, as will be detailed below, the control unit CU can be configured to control a suitable positioning of the patterning device PA, the substrate table WT and the optical components of the projection system PS so as to perform a plurality of alignment measurements, whereby the moveable optical components 13, 14 of the projection system PS are arranged, for each of the alignment measurements, in predetermined positions.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

In order to accurately pattern a substrate such as substrate W with a pattern on a patterning device such as patterning device MA, an accurate spatial alignment of the substrate and the patterning device is required. Performing an alignment process between a patterning device and an substrate is generally known and typically involves projecting a pattern or image of one or more markers that are present on the patterning device onto a sensor arranged on an object table holding the substrate. Typically, such an alignment process involves projecting the pattern along an optical path which comprises one or more optical components such as mirrors or lenses.

In a known lithographic process, the position of the optical components in the optical path are in a fixed position. In addition, the optical components are typically also kept in said fixed position during a subsequent exposure or patterning process.

The present invention relates to determining an aligned position between a patterning device and a substrate, whereby the optical components that are arranged in an optical path between the patterning device and the substrate are movable, rather than being in a fixed position.

Figure 2:
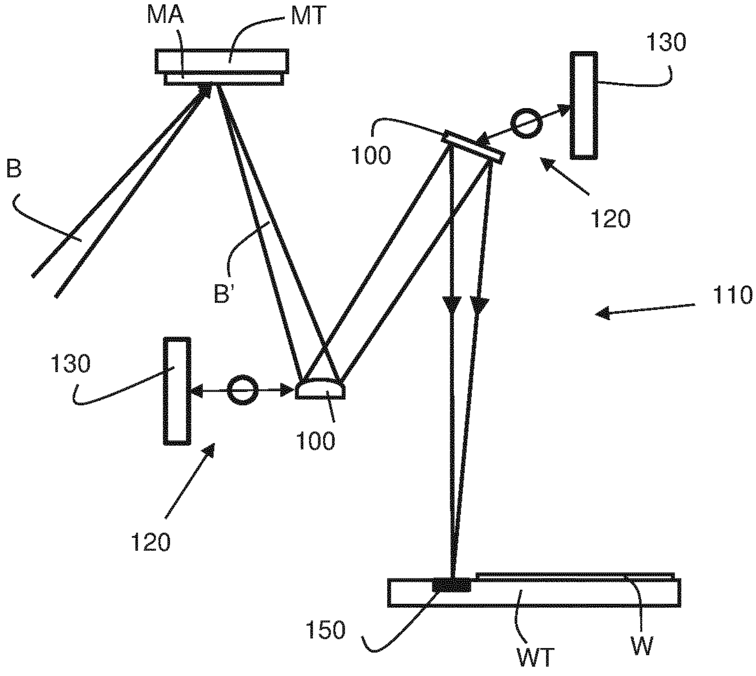
FIG. 2 depicts a system for performing the alignment method according to the invention.

FIG. 2 schematically shows an arrangement including a patterning device and a substrate wherein the present invention can be applied.

FIG. 2 schematically shows a patterning device MA, arranged on a support or support structure MT, a substrate W, arranged on a substrate table WT. In the arrangement as shown, the patterning device MA is configured to receive a radiation beam B, e.g. provided by an illumination system or illuminator, and project the patterned radiation beam B', via an optical path, towards the substrate W or substrate table WT. In the arrangement as shown, the optical path between the pattering 20 device MA and the substrate W comprises multiple moveable optical components 100. The set of optical components 100 may e.g. form part of a projection system 110, similar to projection system PS of FIG. 1. In order to align the patterning device MA with the substrate W, or in order to determine an aligned position between the patterning device and the substrate, the patterned radiation beam B' may e.g. be patterned with a pattern or image of a marker that is present on the patterning device MA. Said patterned radiation beam B' may then be detected by an alignment sensor 150 on the substrate table WT during an alignment process, in order to establish the relative position of the patterning device MA and the substrate table WT. In case the position of the substrate W relative to the substrate table WT is also known, the aligned position between the patterning device MA and the substrate W will be known as well. In the arrangement as shown, a position of the optical components 100 is measured using a position measurement system 120 which may equally form part of the projection system 110. The position measurement system 120 may e.g. be an interferometer based measurement system or an encoder based measurement system. In the arrangement as shown, the position measurement system 120 is configured to measure a position of the optical components 100 relative to a frame 130 of the projection system 110.

In an embodiment, the position measurement system 120 can be configured to measure the position of the optical components 100 in one or more degrees of freedom. In an embodiment, the position measurement system 120 can be configured to measure a position of the optical components in 6 degrees of freedom (6 DOF). In order to do so, the position measurement system 120 can comprise multiple measurement systems. In an embodiment, the position measurement system 120 can e.g. comprise, for each optical component 100, a set of interferometers, e.g. 6 interferometers, to measure a position of the optical component in 6 DOF.

In accordance with the present invention, the projection system 110 as schematically shown in FIG. 2 is intended to project, during use, a patterned beam of radiation, i.e. a radiation beam patterned by the patterning device MA, onto the substrate W. In accordance with an aspect of the present invention, the optical components 100 of the projection system 110 are configured to be displaced during the patterning or exposure process. During the pattering or exposure process an accurate alignment between the patterning device and the substrate is required in order to ensure that the patterned radiation beam is projected on the desired location on the substrate W.

It has been observed by the inventors of the present invention, that the application of the known alignment approach, whereby a spatial alignment between a patterning device and a substrate is determined while the optical components, arranged in an optical path between the patterning device and the substrate, are kept in a fixed position, does not result in an accurate alignment, in case the optical components do not have a fixed position but rather are arranged to be displaceable or moveable, in particular during a patterning or exposure process. It has been devised by the inventors that this inaccuracy in the determined alignment can be caused by an inaccuracy in the applied position measurement system 120 that is used to measure the position of the moveable optical components that are arranged in the optical path between the patterning device and the substrate.

The present invention provides a solution to mitigate this inaccuracy.

According to an aspect of the present invention, a method of spatially aligning a patterning device and a substrate is proposed, whereby the method involves performing a plurality of alignment measurements, wherein for each alignment measurement the moveable optical components are arranged in respective predetermined positions.

In accordance with the present invention, rather than performing an alignment measurement having the optical components arranged in a fixed position, multiple alignment measurements are performed, whereby the moveable optical components are arranged in respective predetermined positions. By performing multiple alignments, having the moveable optical components arranged in respective predetermined positions, the inaccuracy of the position measurement of the moveable optical elements on the determined alignment can be mitigated or reduced. In particular, it has been observed that a more accurate alignment may be derived from a combination of the alignment measurements. As such, the method of aligning a pattering device and a substrate according to the invention further involves combining the alignment measurements. As will be explained in more detail below, combining the alignment measurements, which were obtained with the moveable optical components arranged in respective predetermined positions, enables to determine a more accurate aligned position of the patterning device and the substrate. As a result, the method according to the present invention further proposes the step of spatially aligning the patterning device and the substrate based on the combination of the alignment measurements. As a result of the method of aligning according to the invention, a more accurate alignment of the patterning device and the substrate can be realized. Such an improved alignment can contribute to an improvement in the patterning or exposure process that is performed and which relies on the alignment.

In an embodiment of the present invention, the predetermined positions of the movable optical components as applied during the alignment measurements are selected to average out a position error of the moveable optical components.

As mentioned above, the position measurement system 120 as applied to measure a position of the optical component 100 arranged in the optical path between the patterning device MA and the substrate W may have an inaccuracy. The position of an optical component 100 as measured by the position measurement system 120 may not correspond to the actual position of the optical component. Due to this error, the position of the pattern or image of the marker as projected on the substrate table WT, in particular on the alignment sensor 150, is not in the desired or expected location.

In an embodiment of the present invention, the positioning error of the moveable optical components 100 is considered caused by a cyclic error of the applied position measurement. As is generally known by the skilled person, a position measurement system, in particular an optical position measurement system such as an interferometer based measurement system or an encoder based measurement system, may suffer from what is known as a cyclic error. A cyclic error e(x) of such a position measurement system can e.g. be modeled by a combination of one or more sinusoidal components, whereby the sinusoidal components have a periodicity that can be expressed as an integer fraction of the wavelength 2 as applied by the position measurement system, e.g. position measurement system 120 schematically shown in FIG. 2.

As an example, a cyclic error e(x) as a function of a length x of the measurement beam of the position measurement system may be expressed as:

$$e(x) = a_1\sin\left(\frac{2\pi}{\lambda/4}x + \phi_1\right) + a_2\sin\left(\frac{2\pi}{\lambda/8}x + \phi_2\right) + a_3\sin\left(\frac{2\pi}{\lambda/12}x + \phi_3\right) + a_4\sin\left(\frac{2\pi}{\lambda/16}x + \phi_4\right) \quad (1)$$

In equation (1), amplitudes a1-a4 and phases ϕ1-ϕ4 are generally unknown. In the example given, the cyclic error e(x), which may e.g. represent the cyclic error of a position measurement system 120 measuring the position of a moveable optical component 100 in the x-direction, the cyclic error e(x) comprising 4 components. In particular, the cyclic error e(x) is described as a combination of λ/4, λ/8, λ/12 and λ/16 sinusoidal components, with λ the wavelength of the position measurement system. In an embodiment, the wavelength λ may e.g. be the wavelength of a laser source of the position measurement system. With respect to the amplitudes a1-a4 and phases ϕ1-ϕ4 of the cyclic error e(x), it can be pointed out that these parameters may be different for each component or sub-system of the position measurement system 120. As can be seen in FIG. 2, the position measurement system 120 can include different components or sub-systems, each configured to measure a position of one of the moveable optical components 100. The cyclic error of the position measurement of these different components may thus have different amplitudes and/or phases.

Note that in general, a similar error equation as equation (1) can exist for each measured degree of freedom by each position measurement system. Assuming e.g. that the projection system 110 shown in FIG. 2 comprises 8 moveable optical components 100 which position is measured in 6 DOF, that the positioning error of such a system can be characterized by 48 equations similar to equation (1). As such, when an alignment process would be performed with such a projection system 110 including a position measurement system having the indicated cyclic error, each degree of freedom of each optical component could suffer from a cyclic error in accordance with equation (1).

In accordance with the present invention, a method has been devised to more accurately determine the aligned position between the patterning device MA and the substrate W or substrate table WT. As already indicated above, the method according to the present invention involves applying a plurality of alignment measurements, whereby the moveable optical components that are arranged in the optical path between the patterning device MA and the substrate W are arranged in predetermined positions. In accordance with the present invention, an approach is followed which involves combining multiple alignment measurements, to arrive at an improved alignment or aligned position. Rather than looking for a manner to quantify or characterize the occurring position error, e.g. by finding values for the amplitudes a1-a4 and phases ϕ1-ϕ4 in equation (1), the present invention determines a set of the predetermined positions of the movable optical components as applied during the alignment measurements which enable to mitigate or average out the position error of the moveable optical components. Regarding the expression of the cyclic error, see e.g. equation (1), it can be mentioned that even when all components or sub-systems of the position measurement system have different amplitudes and phases for their cyclic error contributions, and all moveable optical components have a different optical sensitivity relating their position to the location of an image on the substrate, the sum of the resulting movements conforms to a similar equation.

Considering a position error such as the cyclic error described by equation (1), one can understand that, due to the cyclic or periodic nature of the error, the effect of the cyclic error or the effect of each cyclic error component changes sign every half period.

This can be illustrated as follows:

Assuming that the cyclic error only has one component and can be expressed as:

$$e_1(x) = a_1\sin\left(\frac{2\pi}{\lambda/4}x + \phi_1\right) \quad (2)$$

$e_1(x)$ thus describes a cyclic error of a position measurement system as a function of x, x being the direction in which a measurement of a position of a moveable optical component is performed, the cyclic error $e_1(x)$ having a periodicity of λ/4.

In case the moveable optical component would be moved over a distance of λ/8 in the x-direction, the cyclic error $e_1(x)$ would become:

$$e_1\left(x + \frac{\lambda}{8}\right) = a_1\sin\left(\frac{2\pi}{\lambda/4}\left(x + \frac{\lambda}{8}\right) + \phi_1\right) = a_1\sin\left(\frac{2\pi}{\lambda/4}x + \pi + \phi_1\right) = -e_1(x) \quad (3)$$

Equations (2) and (3) thus illustrate that, for a given cyclic error expression, whereby the periodicity of the cyclic error is known, one can find a set of positions for the moveable optical component which can be used in a set of alignment measurements that allow to average out or mitigate the effect of the cyclic error on the determined alignment position. In particular, referring to the embodiment illustrated by equations (2) and (3), one could perform an alignment process twice, once in an initial position and once in a position whereby the moveable optical component is shifted or moved over a distance of λ/8 from the initial position. Note that a similar result can be obtained when the optical component is shifted or moved over a distance of −λ/8 from the initial position, or even over a distance of 3λ/8 or −3λ/8 from the initial position.

Based on equations (2) and (3), one can see that both measurements will have the opposite cyclic error. As such, by taking the average of the set of two alignment measurements, a combined alignment measurement is obtained that is substantially free of a cyclic error.

With respect to the application of a plurality of alignment measurements at respective predetermined positions of the moveable optical components, it can be pointed out that a movement or displacement of the optical components will affect the optical path between the patterning device MA and the substrate W or substrate table WT. In particular, a change in the optical path will thus typically result in a shift or displacement of the nominal position of the image of the marker that is projected during the alignment process. It will be understood that this shift of the nominal position of the image of the marker will need to be taken into account, e.g. by displacing the substrate table WT towards the shifted nominal position.

The above given example whereby the cyclic error comprises only one component can be expanded, e.g. to an example whereby the cyclic error comprises 4 components in accordance with equation (1).

In case there are multiple components that can be identified in the cyclic error of a position measurement system, e.g. 4 components, the method of aligning a patterning device and a substrate according to the invention can have the step of identifying the components of the cyclic error of the applied position measurement or position measurement system. This step of identifying the components of the cyclic error can e.g. involve identifying the periodicity of the components of the cyclic error. As a result of this identification, the cyclic error may e.g. be expressed by equation (1), an expression which still has amplitudes a1-a4 and phases ϕ1-ϕ4 as unknown but in which the periods of the different components, i.e. λ/4, λ/8, λ/12 and λ/16 are identified.

In such case, the cyclic error e(x) can also be expressed as:

$$e(x) = \sum_{n=1}^{4} a_n \sin\left(\frac{2\pi}{\lambda/(4n)}x + \phi_n\right) \tag{4}$$

In general, a cyclic error e(x) having N harmonic components may be expressed as:

$$e(x) = \sum_{n=1}^{N} a_n \sin\left(\frac{2\pi}{\lambda/(4n)}x + \phi_n\right) \tag{5}$$

In accordance with an embodiment of the present invention, a set of J values for x, i.e. x-positions for the moveable optical components, is now sought which meets the criterion that the sum of the measurement errors due to cyclic error is zero:

$$\sum_j e(x_j) = 0 \quad j = 1 \ .... \ J \tag{6}$$

For the error expression given by equation (4), it can be found that, by using the orthogonality property of the sinusoidal terms, a minimum of J=5 positions $x_j$ are required according to:

$$x_j = \frac{j-1}{J} * \lambda/4, \ j = 1 \ ... \ 5 \tag{7}$$

So, in case a cyclic error of a position measurement system can be expressed by equation (4), one can perform a set of 5 measurements taken at positions which are determined in accordance with equation (7) and an averaging of said 5 measurements will be substantially free of the cyclic error. In general, in case the cyclic error contains N harmonic contributions, a set of J=N+1 positions, which are equally distributed along one cycle of the harmonic contribution having the longest period, can be determined such that an averaging of measurements taken at said set of positions will be substantially free of the cyclic error. For the example given by equation (1), the harmonic contribution having the longest period has a period of λ/4.

In case the periods of the different components of the cyclic error have periods equal to λ/4, λ/8, λ/12 and λ/16, equation (7) indicates that the predetermined positions of the moveable optical components need to be x=0, x=λ/20, x=λ/10, x=3λ/20, and x=λ/5, in order to arrive at a set of alignment measurements which, when averaged, are substantially free of a cyclic error of the position measurement of the moveable optical components.

Figure 3:
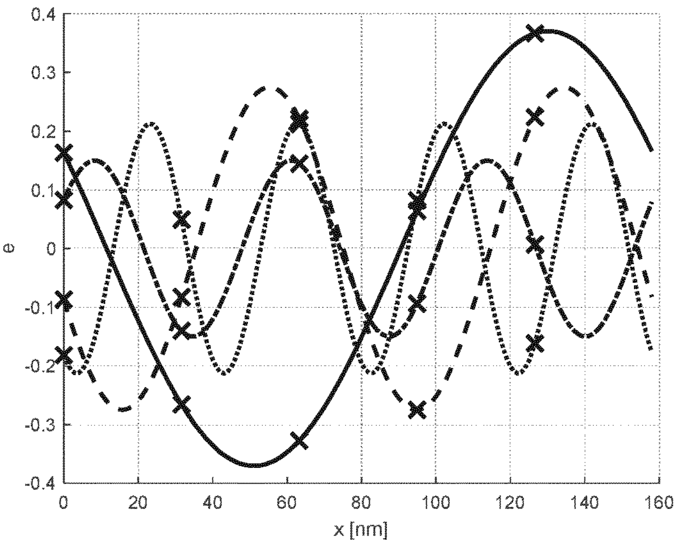
FIG. 3 depicts 4 components of a cyclic error of a position measurement system as can be applied in the present invention.
Figure 4:
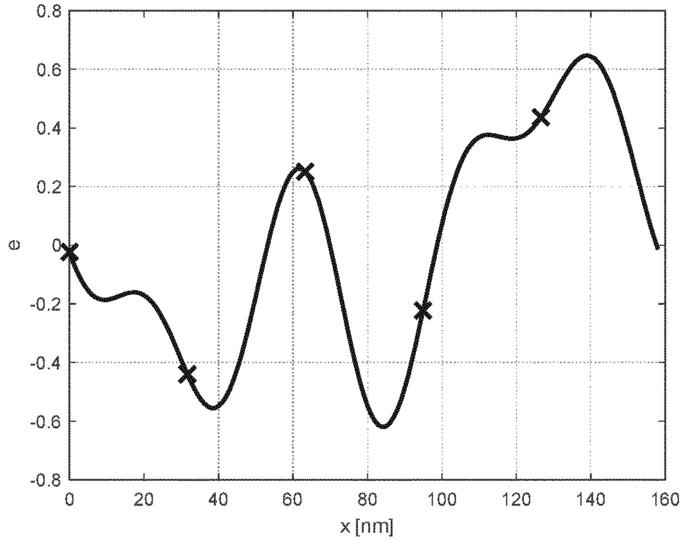
FIG. 4 depicts a resultant cyclic error of the components of the cyclic error and predetermined positions to perform the alignment measurements.

The above example is illustrated in FIGS. 3 and 4 which illustrate the cyclic error of the position measurement system as a function of the x-position of the moveable optical component.

FIG. 3 schematically illustrates the 4 components of the cyclic error e expressed by equation (4) using random values for the amplitudes and phases as a function of the x-position of the moveable optical component which position is measured. The cyclic error e can e.g. be expressed in nm. The 4 components have periods equal to λ/4, λ/8, λ/12 and λ/16, whereby λ=633 nm.

Also indicated in FIG. 3 are the 5 x-positions, indicated by X, corresponding to the predetermined positions of the moveable optical components. The x-values as indicated are x=0, x=λ/20, x=λ/10, x=3λ/20, x=λ/5, or x=0, x=31.65, x=63.3, x=94.95 and x=126.6 nm, respectively.

In FIG. 4, the 4 components contributing to the cyclic error e are added and the resulting cyclic error is shown as a function of the x-position of the moveable optical component. Also indicated in FIG. 4 are the x-positions, indicated by X, corresponding to the predetermined positions of the moveable optical components.

As can be seen, at each of the 5 positions where a measurement is performed, a non-zero cyclic error is found. However, when summing the cyclic errors occurring at the 5 different positions, the resulting error will substantially be zero. As such, the cyclic error at the 5 different positions can be averaged out using the method of the invention. Note that cyclic error will be averaged out, irrespective of the values of the amplitudes and phases of the components of the cyclic error.

The method according to the invention may be applied irrespective of the number of components in the cyclic error that are considered.

In an embodiment, the number of components considered may depend on the amplitude of the different components of the cyclic error. For a given position measurement system, one can in general characterize the occurring cyclic error. In particular, one can characterize or identify the most relevant components, e.g. components having the largest amplitude, and their periodicity or period. Referring to the cyclic error as characterized by equation (1) or equation (4), it may occur that not all 4 components need to be considered. Some of the 4 components may e.g. have a sufficiently low amplitude in order to ignore them.

As such, in an embodiment of the present invention, the cyclic error as identified or considered comprises only two components, the two components having a different period or periodicity.

For such an embodiment, one can determine, in accordance with the present invention, J=3 alignment measurements, each performed at a predetermined position of the moveable optical components. The predetermined positions at which the alignment measurements are to be performed can be determined in accordance with equation (6).

Figure 5:
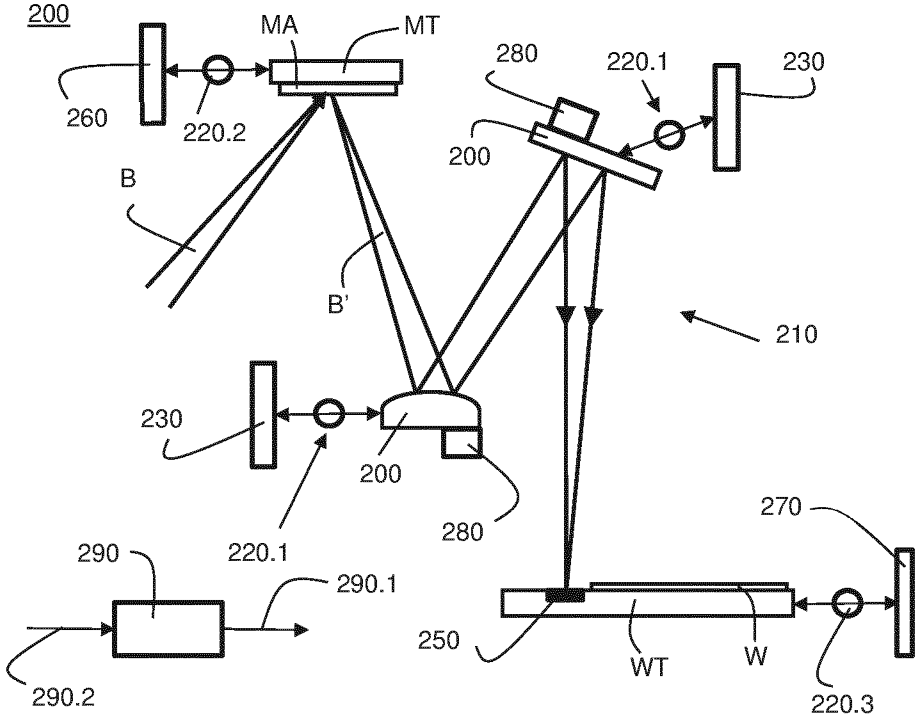
FIG. 5 schematically shows an apparatus according to the invention.

The present invention may also be embodied in an apparatus as schematically shown in FIG. 5. The apparatus 200 as schematically shown in FIG. 5 comprises a support or support structure MT that is configured to support a patterning device MA, a substrate table WT that is configured to support a substrate W and a projection system 210. In the arrangement as shown, the apparatus 200 is configured to receive a radiation beam B to irradiate the patterning device MA. The radiation beam B can e.g. be provided by an illumination system or illuminator. The projection system 210 of the apparatus 200 comprises a set of moveable optical components 200 providing an optical path between the patterning device MA to the substrate table WT or the substrate W. In order to align the patterning device MA with the substrate W, or in order to determine an aligned position between the patterning device and the substrate, the patterned radiation beam B' may, during use, be patterned with a pattern or image of a marker that is present on the patterning device MA. Said patterned radiation beam B' may then be detected by an alignment sensor 250 on the substrate table WT during an alignment process, in order to establish the relative position of the patterning device MA and the substrate table WT. The apparatus 200 further comprises a position measurement system 220 that is configured to determine or measure a position of the support structure, the substrate table and the moveable optical components of the projection system 210. In the embodiment as shown, the position measurement system comprises a first system 220.1 to measure a position of the moveable optical components 200 relative to a frame 230 of the projection system 210. In the embodiment as shown, the position measurement system comprises a second system 220.2 to measure a position of the support system MT relative to a frame 260 of the apparatus 200. In the embodiment as shown, the position measurement system comprises a third system 220.3 to measure a position of the substrate table WT relative to a frame 270 of the projection system 210. Frames 230, 260 and 270 may be part of the same frame or may be different frames. The position measurement systems as applied may e.g. be interferometer based measurement systems or an encoder based measurement systems.

The apparatus 200 as shown further comprises a positioning system 280 configured to position the patterning device, the substrate and the moveable optical components of the projection system. In order to position the patterning device, the support structure MT can comprise one or more motors and/or actuators of the positioning system, e.g. electromagnetic motors or actuators. Similarly, in order to position the substrate W, the substrate table WT can comprise one or more motors and/or actuators of the positioning system, e.g. electromagnetic motors or actuators. Using such positioning system, the patterning device MA and the substrate W may e.g. be positioned in 6 DOF.

As shown, the positioning system as applied in the apparatus 200 further comprises actuators 280 for the positioning of the moveable optical components 200 of the projection system 210. Such actuators can e.g. be electromagnetic or piezo-electric actuators or a combination thereof. The actuators 280 can e.g. be configure to position the moveable optical components 210 in 6 DOF. The apparatus 200 further comprises a control unit 290 which can e.g. be embodied as a computer, controller, microcontroller or the like. The control unit 290 is configured to control the positioning system, in order to accurately position the patterning device MA, the substrate W and the moveable optical components 200. In order to do so, the control unit 290 can generate output signals 290.1 to control the position system, in particular the motors or actuators of the positioning system. To generate the output signals 290.1, the control unit 290 can be configured to receive input signals 290.2 e.g. signals obtained from the position measurement system 220, the signals 290.2 e.g. representing positions of the patterning device MT, the substrate W and the moveable optical components 200.

The apparatus 200 according to the present invention is further configured to perform the method of spatially aligning the patterning device MT and the substrate W according to the present invention, said method being explained in detail above.

In an embodiment, the apparatus according to the invention can be incorporated in a lithographic system, such a system further comprising a radiation source and an illumination system or illuminator.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of spatially aligning a patterning device and a substrate, wherein the patterning device and the substrate are separated by an optical path comprising one or more moveable optical components, the method comprising:

performing a plurality of alignment measurements, wherein for each alignment measurement the one or more moveable optical components are arranged in respective predetermined positions, combining the plurality of alignment measurements, and spatially aligning the patterning device and the substrate based on the combination of the plurality of alignment measurements, wherein the respective predetermined positions of the movable optical components are selected to average out a positioning error of the one or more moveable optical components, and wherein the positioning error of the one or more moveable optical components is caused by a cyclic error of a position measurement of the one or more moveable optical components.

2. The method of claim 1, wherein combining the plurality of alignment measurements comprises averaging the plurality of alignment measurements.

3. The method of claim 1, further comprising:

identifying one or more components of the cyclic error of the position measurement and a periodicity of the one or more components; and determining the respective predetermined positions of the one or more moveable optical components based on the periodicity of the one or more components of the cyclic error.

4. The method of claim 3, wherein the cyclic error comprises two components having a different periodicity.

5. The method of claim 4, wherein:

the performing the plurality of alignment measurements comprises performing three alignment measurements, and the combining the plurality of alignment measurements comprises averaging the plurality of alignment measurements.

6. The method of claim 3, wherein the cyclic error comprises N components, N>1, and is expressed as:

$$e(x) = \sum_{n=1}^{N} a_n \sin\left(\frac{2\pi}{\lambda/(4n)} x + \phi_n\right)$$

wherein $a_n$ and $\phi_n$ represent an amplitude and a phase of the components, wherein $\lambda$ represents a wavelength of a radiation source applied to perform the position measurements, and wherein x represents a position in a measurement direction of the position measurement.

7. The method of claim 6, wherein the predetermined positions $x_j$ of the one or more moveable optical components is expressed as:

$$x_j = \frac{j-1}{J} * \lambda/4,\ j = 1 \ldots J,\ J = N+1.$$

8. The method of claim 1, wherein the position measurement is performed using an interferometer measurement system or an encoder measurement system.

9. An apparatus comprising:

a support structure configured to support a patterning device;

a substrate table configured to support a substrate;

a projection system comprising one or more moveable optical components, the one or more moveable optical components providing an optical path between the patterning device and the substrate;

a positioning system configured to position the patterning device, the substrate and the one or more moveable optical components of the projection system;

a position measurement system configured to measure a position of the support structure, the substrate table and the one or more moveable optical components of the projection system;

a control unit configured to control the positioning system; and wherein the apparatus is configured to receive a radiation beam to irradiate the patterning device, and wherein the control unit is configured to control the apparatus to perform a method of spatially aligning the patterning device and the substrate by:

performing alignment measurements, wherein for each alignment measurement the one or more moveable optical components are arranged in respective predetermined positions, combining the plurality of alignment measurements, and spatially aligning the patterning device and the substrate based on the combination of the plurality of alignment measurements, wherein the respective predetermined positions of the movable optical components are selected to average out a positioning error of the one or more moveable optical components, and wherein the positioning error of the one or more moveable optical components is caused by a cyclic error of a position measurement of the one or more moveable optical components.

10. A lithographic system comprising:

the apparatus of claim 9:

a radiation source; and an illumination system configured to generate the radiation beam.

11. The lithographic system of claim 10, wherein the radiation source is an EUV radiation source.

12. The lithographic system of claim 10, wherein the one or more moveable optical components are EUV mirrors.

* * * * *